United States Patent
Sudo

(10) Patent No.: US 8,675,323 B2
(45) Date of Patent: Mar. 18, 2014

(54) METHOD OF MANUFACTURING A PACKAGE

(75) Inventor: Minoru Sudo, Chiba (JP)

(73) Assignee: Seiko Instruments Inc., Chiba (JP)

( * ) Notice: Subject to any disclaimer, the term of this patent is extended or adjusted under 35 U.S.C. 154(b) by 7 days.

(21) Appl. No.: 13/432,464

(22) Filed: Mar. 28, 2012

(65) Prior Publication Data
US 2012/0250198 A1 Oct. 4, 2012

(30) Foreign Application Priority Data

Mar. 29, 2011 (JP) ................. 2011-072736

(51) Int. Cl.
*H02H 3/20* (2006.01)
*H02H 9/04* (2006.01)

(52) U.S. Cl.
USPC ............. 361/56; 361/91.1; 361/91.5; 361/54

(58) Field of Classification Search
USPC .......................................................... 361/56
See application file for complete search history.

(56) References Cited

U.S. PATENT DOCUMENTS

| 5,517,050 | A | | 5/1996 | Koyabu | |
|---|---|---|---|---|---|
| 5,536,977 | A | * | 7/1996 | Williams | 307/43 |
| 5,576,635 | A | * | 11/1996 | Partovi et al. | 326/27 |
| 6,552,372 | B2 | * | 4/2003 | Wu et al. | 257/173 |
| 6,867,957 | B1 | * | 3/2005 | Tong et al. | 361/56 |
| 6,870,417 | B2 | * | 3/2005 | Mercier | 327/493 |
| 7,129,652 | B2 | * | 10/2006 | Patel et al. | 315/291 |
| 2005/0237682 | A1 | * | 10/2005 | Wu et al. | 361/56 |

* cited by examiner

*Primary Examiner* — Rexford Barnie
*Assistant Examiner* — Zeev V Kitov
(74) *Attorney, Agent, or Firm* — Brinks Gilson & Lione

(57) ABSTRACT

Provided is an ESD protection circuit for CDM capable of preventing a high current from flowing and preventing breakage when a battery is connected with reverse polarity. The ESD protection circuit employs a circuit configuration in which transistor elements are interposed in series to OFF transistors (11 and 13) included in the ESD protection circuit for CDM so that parasitic diodes of the transistor elements are connected to parasitic diodes of the OFF transistors in a reverse direction.

6 Claims, 4 Drawing Sheets

8,675,323 B2

METHOD OF MANUFACTURING A PACKAGE

RELATED APPLICATIONS

This application claims priority under 35 U.S.C. §119 to Japanese Patent Application No. 2011-072736 filed on Mar. 29, 2011, the entire content of which is hereby incorporated by reference.

BACKGROUND OF THE INVENTION

1. Field of the Invention

The present invention relates to an electro-static discharge (ESD) protection element for preventing a high current from flowing and preventing breakage even when a battery is connected with reverse polarity by mistake.

2. Description of the Related Art

As a conventional input circuit for a semiconductor integrated circuit (hereinafter, referred to as IC), a circuit as illustrated in FIG. 4 has been known (see, for example, Japanese Patent Application Laid-open No. Hei 7-153846 (FIG. 1)).

The IC includes a positive (plus) power supply terminal 121, a negative (minus) power supply terminal 122, and at least one input terminal 120. The positive power supply terminal 121 is connected to a plus terminal of a battery 101 and the negative power supply terminal 122 is connected to a minus terminal of the battery 101. Between the input terminal 120 and the negative power supply terminal 122, a main ESD protection circuit 100 is normally disposed in the vicinity of a pad of the IC.

An internal circuit (inverter) 130 that receives a signal of the input terminal 120 is provided. As charged device model (CDM) measures for protecting a gate thereof from electrostatic discharge (ESD), an ESD protection circuit 110 is disposed near the internal circuit 130. The ESD protection circuit 110 includes an N-channel transistor 11, a P-channel transistor 13, and a resistor 15. Drains of the N-channel transistor 11 and the P-channel transistor 13 are connected to the gate of the internal circuit 130. A gate, a source, and a substrate of the N-channel transistor 11 are connected to VSS. A gate, a source, and a substrate of the P-channel transistor 13 are connected to VDD. The N-channel transistor 11 and the P-channel transistor 13 are in an OFF state (high impedance state). In a normal operating state, the presence or absence of the N-channel transistor 11 and the P-channel transistor 13 does not affect the operation of the internal circuit. The resistor 15 for ESD protection may be a resistor having a given value (for example, about 1 kΩ) interposed by design, or may be a parasitic resistance of wiring of the IC.

In a CDM, in the state in which the IC is charged to a high voltage, when the voltage is discharged from the input terminal 120, electric charges of the internal circuit 130 on the substrate side are generally discharged rapidly via the substrate and the main ESD protection circuit 100. On the other hand, electric charges of the gate of the internal circuit 130 are discharged slowly because of the resistor 15. As a result, a high voltage is applied instantaneously between the gate and the substrate of the internal circuit 130, and the breakage of the gate of the internal circuit may occur. In order to prevent the breakage, the OFF transistors 11 and 13 are interposed between the gate of the internal circuit and the positive power supply terminal 121 and the negative power supply terminal 122, respectively, so that the OFF transistors 11 and 13 are broken down before a high voltage is applied between the gate of the internal circuit and the respective power supply terminals. In this way, the gate of the internal circuit can be prevented from being applied with a high voltage, and the breakage in the CDM can be prevented.

Note that, reference symbols 11D and 13D represent parasitic diodes of the N-channel transistor 11 and the P-channel transistor 13, respectively.

FIG. 5 illustrates an example of an image diagram of IC layout. There are three pads of a VDD PAD connected to the VDD terminal, an IN PAD connected to the IN terminal, and a VSS PAD connected to the VSS terminal. In the vicinity of the IN PAD, the main ESD protection circuit 100 is laid out. The internal circuit 130 is laid out inside the IC, and, in the vicinity thereof, the ESD protection circuit 110 for CDM measures is laid out.

FIG. 5 illustrates only three pads, but a normal IC includes a larger number of pads and circuits.

The conventional protection circuit, however, has the following problem. When the battery is connected with reverse polarity, the parasitic diodes of the respective ESD protection elements are biased in the forward direction, and a current flows to generate heat.

SUMMARY OF THE INVENTION

Therefore, it is an object of the present invention to solve the conventional problem and provide an ESD protection circuit capable of preventing a current from flowing and preventing breakage even when a battery is connected with reverse polarity.

The present invention solves the above-mentioned problem by employing a circuit configuration in which transistor elements are interposed in series to OFF transistors included in an ESD protection circuit for CDM so that parasitic diodes of the transistor elements are connected to parasitic diodes of the OFF transistors in a reverse direction.

According to the ESD protection circuit of the present invention described above, a high current can be prevented from flowing to an IC and the breakage can be prevented even when a battery is connected with reverse polarity.

DETAILED DESCRIPTION OF THE PREFERRED EMBODIMENTS

Figure 1:
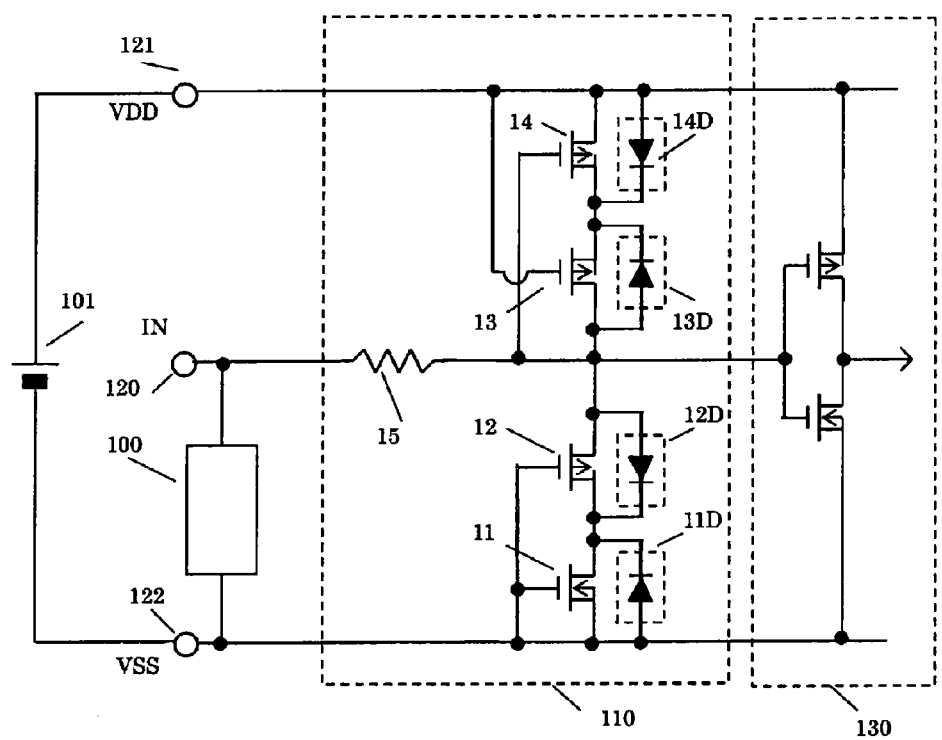
FIG. 1 illustrates an ESD protection circuit according to a first embodiment of the present invention.

Referring to the drawings, embodiments of the present invention are described.

(First Embodiment)

FIG. 1 is a circuit diagram of an electro-static discharge (ESD) protection circuit according to a first embodiment of the present invention. An ESD protection circuit 110 according to the first embodiment of the present invention includes an N-channel transistor 11, P-channel transistors 12, 13, and 14, and a resistor 15. The resistor 15 is similar to the conventional one, and may be provided by design or may be a parasitic resistance of wiring.

A gate, a source, and a substrate of the N-channel transistor 11 are connected to VSS, and a drain thereof is connected to a source and a substrate (well) of the P-channel transistor 12. A gate of the P-channel transistor 12 is connected to VSS, and a drain thereof is connected to a gate of an internal circuit 130, the resistor 15, a drain of the P-channel transistor 13, and a gate of the P-channel transistor 14. A drain of the P-channel transistor 14 is connected to VDD, and a source and a substrate (well) thereof are connected to a source and a substrate (well) of the P-channel transistor 13. A gate of the P-channel transistor 13 is connected to VDD, and a drain thereof is connected to the gate of the internal circuit 130, the resistor 15, the drain of the P-channel transistor 12, and the gate of the P-channel transistor 14. Reference symbols 11D, 12D, 13D, and 14D represent parasitic diodes of the N-channel transistor 11 and the P-channel transistors 12, 13, and 14, respectively.

Figure 4:
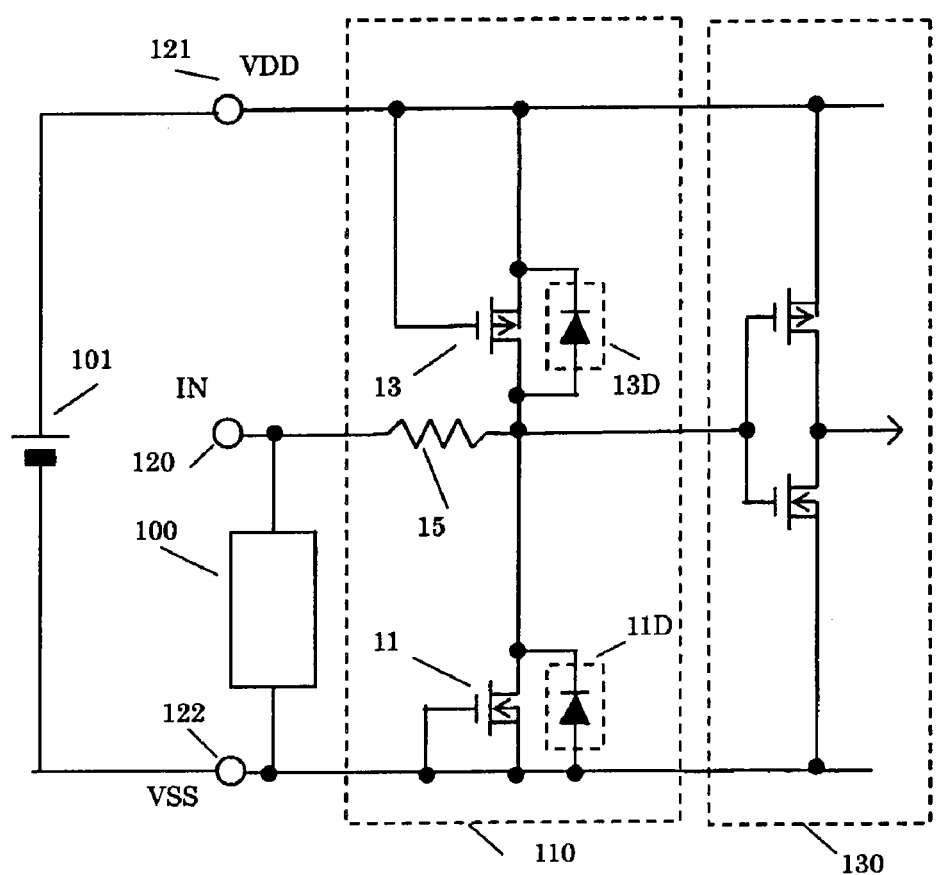
FIG. 4 illustrates a conventional ESD protection circuit.
Figure 5:
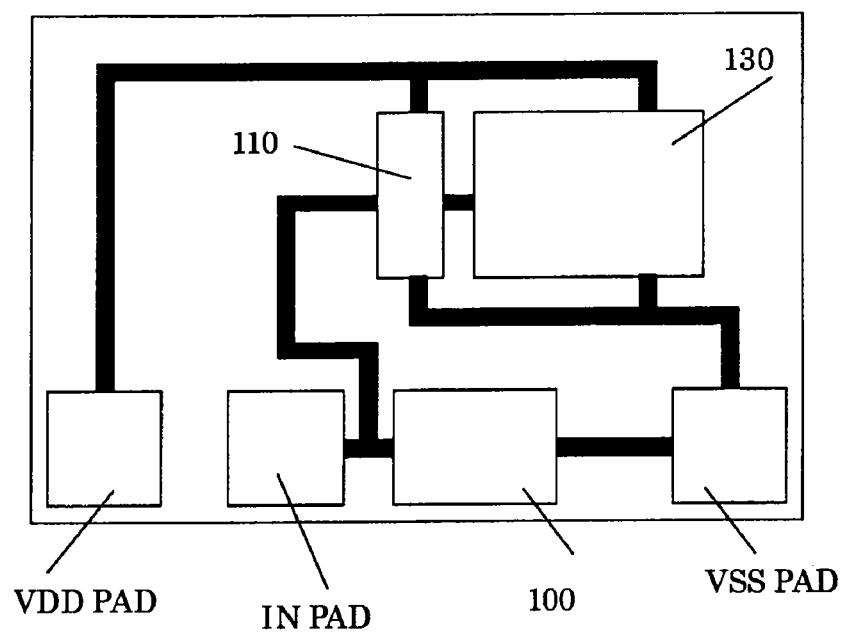
FIG. 5 is an image diagram of IC layout.

Comparing with the conventional ESD protection circuit of FIG. 4, the N-channel transistor 11 and the P-channel transistor 13 function as OFF transistors similarly to the conventional ones and the P-channel transistors 12 and 14 are added.

Next, the operations performed when a battery is normally connected and when the battery is connected with reverse polarity are described. FIG. 1 illustrates the state in which the battery is normally connected. In this state, each of the N-channel transistor 11 and the P-channel transistor 13 functions as an OFF transistor similarly to the conventional ones and the impedance thereof is high. Therefore, even if the P-channel transistors 12 and 14 are added, the operation is not affected.

Next, in a CDM, in the state in which an IC is charged to a high voltage, when the voltage is discharged from the input terminal 120, even if the gate of the internal circuit 130 tries to have a higher potential than that of the VSS terminal, the P-channel transistor 12 is turned ON so that a gate voltage of the internal circuit 130 is applied to the drain of the N-channel transistor 11. Accordingly, the N-channel transistor 11 is broken down as an OFF transistor, and a high voltage difference is not applied between the gate of the internal circuit 130 and VSS. On the other hand, even if the gate of the internal circuit 130 tries to have a lower potential than that of the VSS terminal, the parasitic diode 11D of the N-channel transistor 11 is turned ON so that substantially the same voltage as that of the VSS terminal is applied to the source of the P-channel transistor 12. Accordingly, the P-channel transistor 12 is broken down as an OFF transistor, and a high voltage difference is not applied between the gate of the internal circuit 130 and VSS.

Similarly, even if the gate potential of the internal circuit 130 tries to be higher than that of the VDD terminal, the P-channel transistor 13 is turned ON so that the voltage of the VDD terminal is applied to the source and the substrate (well) of the P-channel transistor 14. Accordingly, the P-channel transistor 14 is broken down as an OFF transistor, and a high voltage difference is not applied between the gate of the internal circuit 130 and VDD. On the other hand, even if the gate of the internal circuit 130 tries to have a lower potential than that of the VDD terminal, the P-channel transistor 14 is turned ON so that the voltage of the VDD terminal is applied to the drain of the P-channel transistor 13. Accordingly, the P-channel transistor 13 is broken down as an OFF transistor, and a high voltage difference is not applied between the gate of the internal circuit 130 and VDD.

In other words, the ESD protection circuit for CDM functions similarly to the conventional one.

On the other hand, when the battery is connected with reverse polarity, no path in which diodes are connected in the forward direction is formed between VDD and VSS (because diodes in the reverse direction are always connected in series), and hence no current flows as opposed to the conventional case. Further, even when the input terminal 120 is connected to VDD or VSS, no path in which diodes are connected in the forward direction is formed between the input terminal 120 and VDD or VSS (because diodes in the reverse direction are always connected in series), and hence no current flows.

Figure 2:
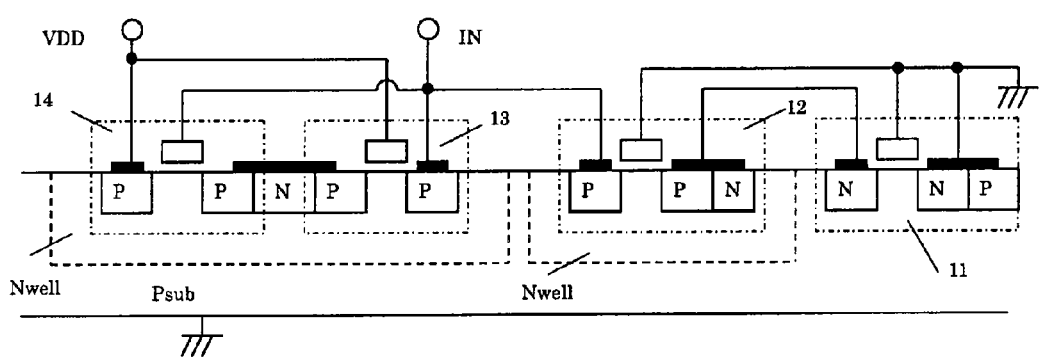
FIG. 2 is a cross-sectional diagram of the ESD protection circuit according to the first embodiment of the present invention.

FIG. 2 illustrates a cross-sectional diagram of the N-channel transistor 11 and the P-channel transistors 12, 13, and 14. The transistors are connected to the input terminal 120 (IN) via the resistor 15, but, in FIG. 2, the resistor 15 is omitted. On a P-substrate, a first N-well and a second N-well are provided. The P-channel transistors 13 and 14 are manufactured in the first N-well, and the P-channel transistor 12 is manufactured in the second N-well.

As described above, the N-channel transistor 11 and the P-channel transistor 12 have an effect to the CDM between VSS and the gate input of the internal circuit 130, and the P-channel transistors 13 and 14 have an effect to the CDM between VDD and the gate input of the internal circuit 130. Therefore, it is apparent that the effect to the CDM can be obtained even only with the transistors between the internal circuit and one of VDD and VSS.

(Second Embodiment)

Figure 3:
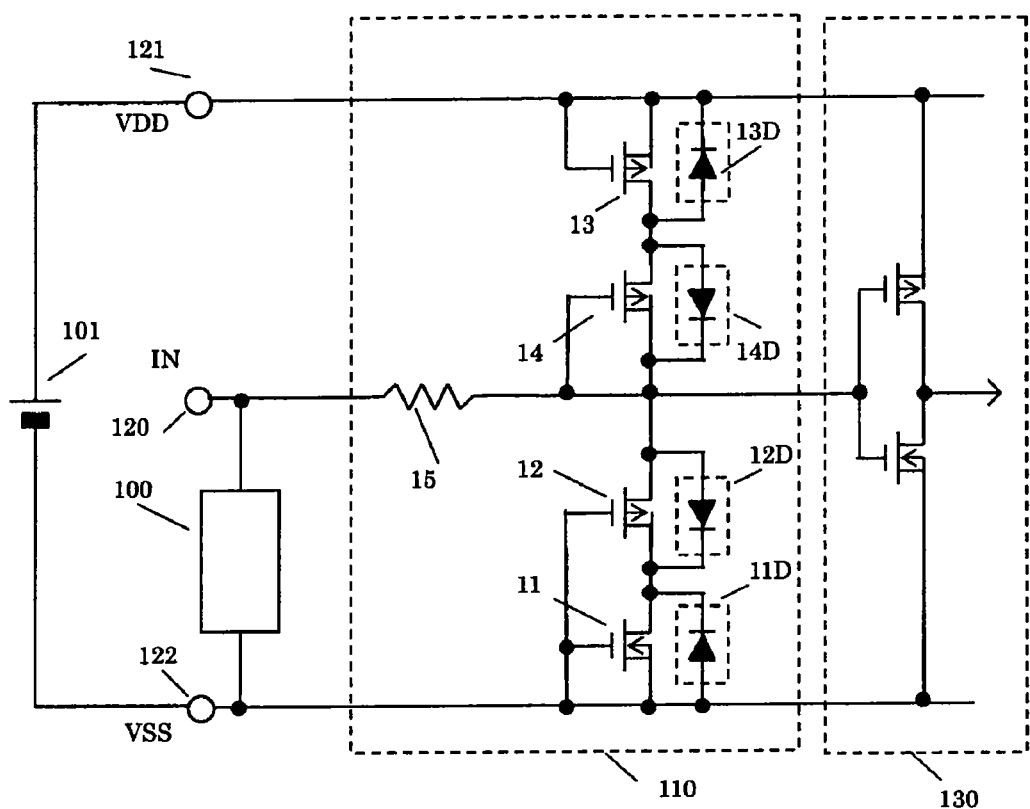
FIG. 3 illustrates an ESD protection circuit according to a second embodiment of the present invention.

FIG. 3 illustrates an ESD protection circuit according to a second embodiment of the present invention. The difference from FIG. 2 resides in that the P-channel transistors 13 and 14 switch their positions between VDD and the input gate of the internal circuit. In other words, the gate, the source, and the substrate (well) of the P-channel transistor 13 are connected to VDD, and the drain thereof is connected to the drain of the P-channel transistor 14, and the source, the substrate (well), and the gate of the P-channel transistor 14 are connected to the drain of the P-channel transistor 12, the resistor 15, and the gate of the internal circuit 130.

Similarly to the first embodiment, in the state in which the battery is normally connected (state of FIG. 3), the transistors 13 and 14 are turned OFF (in high impedance state) and therefore do not affect the operation.

Next, in a CDM, in the state in which an IC is charged to a high voltage, when the voltage is discharged from the input terminal 120, even if the gate of the internal circuit 130 tries to have a higher potential than that of the VDD terminal, substantially the same voltage as that of the VDD terminal is applied to the drain of the P-channel transistor 14 because the parasitic diode 13D of the P-channel transistor 13 is in the forward direction. Accordingly, the P-channel transistor 14 is broken down as an OFF transistor, and a high voltage difference is not applied between the gate of the internal circuit 130 and VDD. On the other hand, even if the gate of the internal circuit 130 tries to have a lower potential than that of the VDD terminal, substantially the same voltage as that of the gate of the internal circuit 130 is applied to the drain of the P-channel transistor 13 because the parasitic diode 14D of the P-channel transistor 14 is in the forward direction. Accordingly, the P-channel transistor 13 is broken down as an OFF transistor, and a high voltage difference is not applied between the gate of the internal circuit 130 and VDD.

When the battery is connected with reverse polarity, similarly to the first embodiment, no path in which diodes are connected in the forward direction is formed between VDD and VSS (because diodes in the reverse direction are always connected in series), and hence no current flows. Further, even when the input terminal 120 is connected to VDD or VSS, no path in which diodes are connected in the forward direction is formed between the input terminal 120 and VDD or VSS (because diodes in the reverse direction are always connected in series), and hence no current flows.

Further, the N-channel transistor 11 and the P-channel transistors 12, 13, and 14 serving as ESD protection elements for CDM have the purpose of dissipating electric charges of the gate of the internal circuit 130, and hence, even when the W lengths (transistor widths) of the N-channel transistor 11 and the P-channel transistors 12, 13, and 14 are smaller than the W length of the main ESD protection element 100, a sufficient effect can be obtained. The W lengths may be 50 μm or less.

What is claimed is:

1. An ESD protection circuit for a semiconductor integrated circuit comprising at least a positive power supply terminal, a negative power supply terminal, an input terminal, and an internal circuit being connected to the input terminal, the ESD protection circuit comprising:
   an N-channel transistor including a gate, a source, and a substrate each connected to the negative power supply terminal; and
   a first P-channel transistor including a gate connected to the negative power supply terminal, a drain connected to a gate of the internal circuit, and a source and a substrate each connected to a drain of the N-channel transistor, the source including a P-N junction, such that a parasitic diode resides between the source and the drain that is forward biased from the drain to the source.

2. An ESD protection circuit according to claim 1, wherein the N-channel transistor and the first P-channel transistor each have a width of 50 μm or less.

3. An ESD protection circuit for a semiconductor integrated circuit comprising at least a positive power supply terminal, a negative power supply terminal, an input terminal, and an internal circuit being connected to the input terminal, the ESD protection circuit comprising:
   a N-channel transistor including a gate, a source, and a substrate each connected to the negative power supply terminal;
   a first P-channel transistor including a gate connected to the negative power supply terminal, a drain connected to a gate of the internal circuit, and a source and a substrate each connected to a drain of the N-channel transistor, the source including a P-N junction, such that a parasitic diode resides between the source and the drain that is forward biased from the drain to the source;
   a second P-channel transistor including a gate connected to the positive power supply terminal and a drain connected to the gate of the internal circuit; and
   a third P-channel transistor including a gate connected to the gate of the internal circuit, a drain connected to the positive power supply terminal, and a source and a substrate each connected to a source and a substrate of the second P-channel transistor, the source including a P-N junction, such that a parasitic diode resides between the source and the drain that is forward biased from the drain to the source.

4. An ESD protection circuit according to claim 3, wherein the N-channel transistor and the first P-channel transistor each have a width of 50 μm or less.

5. An ESD protection circuit for a semiconductor integrated circuit comprising at least a positive power supply terminal, a negative power supply terminal, an input terminal, and an internal circuit being connected to the input terminal, the ESD protection circuit comprising:
   an N-channel transistor including a gate, a source, and a substrate which are connected to the negative power supply terminal;
   a first P-channel transistor including a gate connected to the negative power supply terminal, a drain connected to a gate of the internal circuit, and a source and a substrate each connected to a drain of the N-channel transistor, the source including a P-N junction, such that a parasitic diode resides between the source and the drain that is forward biased from the drain to the source;
   a second P-channel transistor including a gate, a source, and a substrate each connected to the positive power supply terminal; and
   a third P-channel transistor including a gate, a source, and a substrate each connected to the gate of the internal circuit, and a drain connected to a drain of the second P-channel transistor, the source including a P-N junction, such that a parasitic diode resides between the source and the drain that is forward biased from the drain to the source.

6. An ESD protection circuit according to claim 5, wherein the N-channel transistor and the first P-channel transistor each have a width of 50 μm or less.

* * * * *